United States Patent [19]
Thundat et al.

[11] Patent Number: 6,005,400
[45] Date of Patent: Dec. 21, 1999

[54] HIGH RESOLUTION THREE-DIMENSIONAL DOPING PROFILER

[75] Inventors: Thomas G. Thundat; Robert J. Warmack, both of Knoxville, Tenn.

[73] Assignee: Lockheed Martin Energy Research Corporation, Oakridge, Tenn.

[21] Appl. No.: 08/916,345

[22] Filed: Aug. 22, 1997

[51] Int. Cl.[6] .............................. G01R 1/04; G01R 31/26
[52] U.S. Cl. ............................................ 324/752; 324/767
[58] Field of Search ...................... 324/765, 752, 324/753, 751, 750, 767, 158.1, 73.1, 71.3; 250/352, 310, 311; 257/48; 438/14, 188

[56] References Cited

U.S. PATENT DOCUMENTS

| | | | |
|---|---|---|---|
| 3,867,697 | 2/1975 | Vanzetti et al. | 324/752 |
| 4,456,879 | 6/1984 | Kleinknecht | 324/767 |
| 4,736,159 | 4/1988 | Shiragasawa et al. | 324/752 |
| 4,968,932 | 11/1990 | Baba et al. | 324/767 |
| 5,519,334 | 5/1996 | Dawson | 324/765 |
| 5,659,244 | 8/1997 | Sakaguchi | 324/158.1 |
| 5,708,371 | 1/1998 | Koyama | 324/752 |
| 5,770,946 | 6/1998 | Patterson | 324/752 |

*Primary Examiner*—Josie Ballato
*Assistant Examiner*—Minh Tang
*Attorney, Agent, or Firm*—Jones & Askew, LLP

[57] ABSTRACT

A semiconductor doping profiler provides a Schottky contact at one surface and an ohmic contact at the other. While the two contacts are coupled to a power source, thereby establishing an electrical bias in the semiconductor, a localized light source illuminates the semiconductor to induce a photocurrent. The photocurrent changes in accordance with the doping characteristics of the semiconductor in the illuminated region. By changing the voltage of the power source the depth of the depletion layer can be varied to provide a three dimensional view of the local properties of the semiconductor.

20 Claims, 3 Drawing Sheets

HIGH RESOLUTION THREE-DIMENSIONAL DOPING PROFILER

This invention was made with government support under Contract No. DE-AC05-840R21400 awarded by the U.S. Department of Energy to Martin Marietta Energy Systems, Inc. and the government has certain rights in this invention.

BACKGROUND OF THE INVENTION

The present invention relates generally to the field of measuring and testing, and more specifically, to a three-dimensional semiconductor doping profiler. A restricted illumination source, such as a near-field scanning optical microscope, directs light at a small region of an electrically biased semiconductor surface. The bias on the semiconductor creates a space-charge region in the body of the semiconductor to a depth controlled by an external applied bias, and electrical current changes in the semiconductor are recorded during scanning at each bias level to provide a series of data related to local internal doping profiles. Scanning the illumination source laterally with respect to the semiconductor surface can then be used to generate a three dimensional doping profile.

FIELD OF THE INVENTION

It is important to know the three dimensional doping distribution characteristics of a semiconductor wafer to insure high quality devices and to decrease failure rates. This is especially true as smaller devices (to less than 100 nanometers) are fabricated on wafer surfaces. The failure or poor performance of only one component can ruin the function of a large scale integrated circuit device. Information with details at least on the size scale of these devices is essential to providing proper diagnostics in the manufacture of these devices.

Currently used techniques such as secondary ion mass spectrometry (SIMS) and spreading resistance measurements do not have enough lateral resolution. Secondary ion mass spectrometry is also destructive. Depth profiling using spreading resistance require special sample preparation. Although scanning tunneling and atomic force microscopy can provide a high spatial resolution image of a surface, they are unable to detect localized changes in doping concentration unambiguously.

U.S. Pat. No. 5,042,949 to Greenberg describes an optical profiler for films and substrates, in which a microscope alternatively configured in interferometric mode and in spectrographic mode provides phase data from an interference pattern and reflectance data from a reflectance pattern. Film thickness profiles are computed based on these data.

U.S. Pat. No. 5,162,867 to Kohno describes a surface condition light-based inspection device used to identify foreign particles which might adversely affect images formed on a wafer.

U.S. Pat. No. 5,392,113 to Sayka et al. describes a semiconductor wafer defect monitoring device in which uses a light reflected off the underside of a wafer to monitor for the presence of staining of the surface. No three-dimensional profiling is provided.

U.S. Pat. No. 5,330,384 to Yamada et al. describes a method of inspecting wafers in which light of a predetermined wavelength is directed at a layered structure, and a defect is detected by observing the photoluminescent light which results.

U.S. Pat. No. 4,917,462 to Lewis et al. discloses a near field scanning optical microscopy device which uses a tapered metal coated glass pipette having a thin tip. A method of forming the pipette is provided. Light is transmitted down through the pipette and onto the surface of a sample, and returned light is analyzed by a detector to provide a surface profile.

U.S. Pat. No. 4,456,879 to Kleinknecht describes a method and apparatus for determining the doping profile in epitaxial layers of semiconductors. A laser light modifies a d.c. current passing through the epitaxial layer, and changes in conductivity are correlated to the layer material.

While it is clear that several attempts have been made in the past to non-destructively evaluate semiconductor subsurface characteristics, a continuing and increasing need exists for an improved high resolution, three-dimensional semiconductor doping profiler.

SUMMARY OF THE INVENTION

An object of the present invention is to provide a profiler that provides information on the three dimensional doping distribution in a semiconductor wafer, thereby ensuring the production of high quality devices and reducing failure rates.

Another object of the present invention is to provide a semiconductor doping profiler that is effective for devices on the size scale of less than 100 nanometers and has good lateral resolution.

Another object of the present invention is to provide a semiconductor doping profiler that can detect localized changes in doping concentration unambiguously.

These and other objects of the invention are met by providing a semiconductor doping profiler that includes first contact means for forming an ohmic contact with one surface of the semiconductor, second contact means for forming a Schottky contact with an opposite surface of the semiconductor, voltage means coupled to the first and second contact means for establishing an electrical bias in the semiconductor which results in a space charge region in the semiconductor that varies in accordance with doping characteristics of the semiconductor and the applied electrical bias, and means for illuminating the space charge region with light energy to generate a photocurrent which is proportional to the doping concentration of the illuminated region.

These together with other objects and advantages which will be subsequently apparent, reside in the details of construction and operation as more fully hereinafter described and claimed, with reference being had to the accompanying drawings forming a part hereof, wherein like numerals refer to like elements throughout.

DETAILED DESCRIPTION OF THE PREFERRED EMBODIMENTS

The present invention includes two methods, employing different apparatuses, for illuminating a localized region of the space-charge layer. Conventional far-field optical microscopy using refractive or reflective lenses can be used to confine the exciting light spot to diameters of the order of the wavelength of light. In another embodiment, a near-field optical microscope is used to illuminate a region comparable with the aperture (10–100 nanometers) at the end of a sharpened optical fiber. In both cases, signal detection is facilitated by modulating the light and synchronously detecting the photocurrent.

Figure 1:
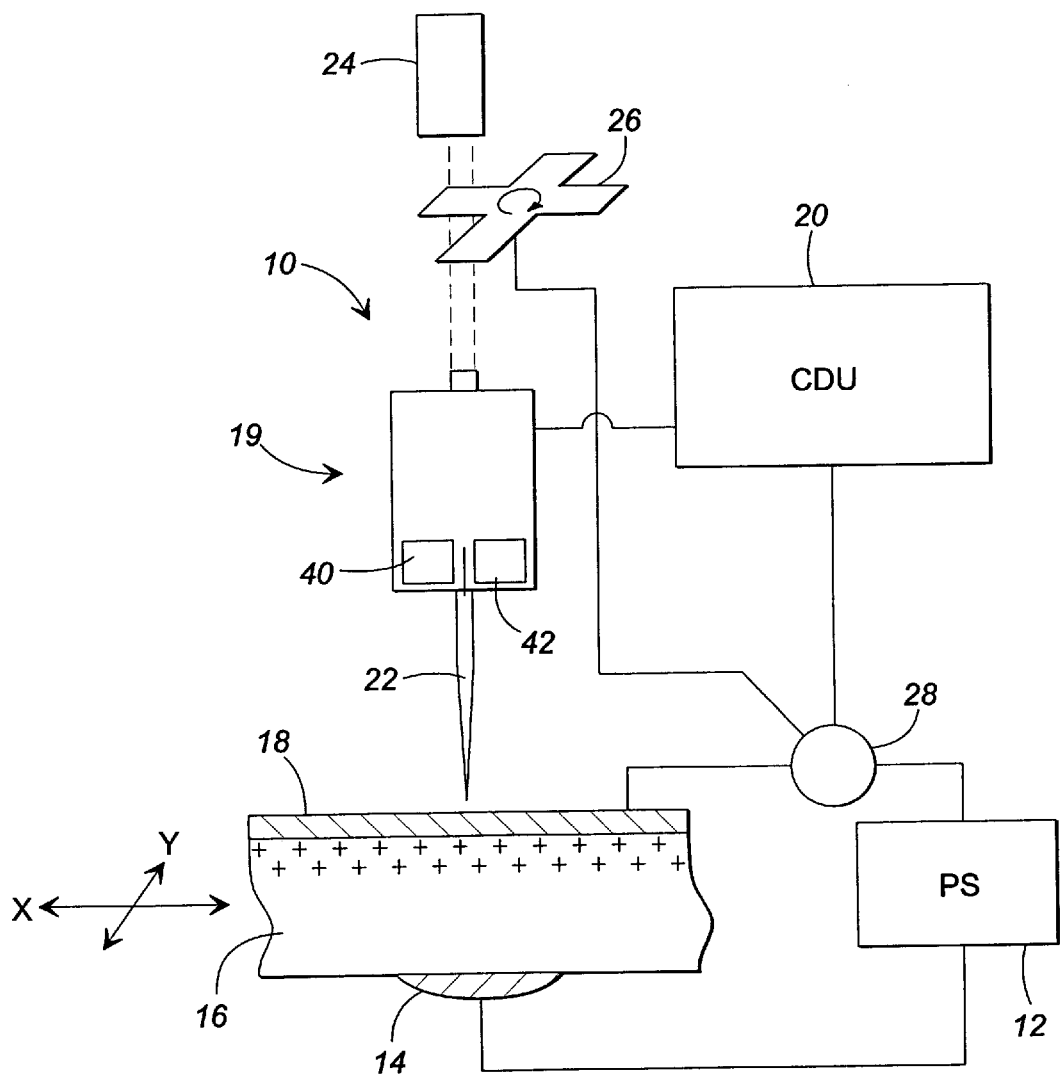
FIG. 1 is a schematic view of a preferred embodiment of the present invention.

The near-field embodiment is illustrated in FIG. 1. A doping profiler 10 includes a power supply (PS) 12 connected to an ohmic contact 14 on one side of a semiconductor 16 and a Schottky contact 18 on the other. The Schottky contact 18 is deposited as a metallic film on the upper surface of the semiconductor 16.

The power supply 12 establishes an electrical bias in the semiconductor 16 which creates a space-charge region, or depletion region, as indicated by the positive signs in FIG. 1. The location or depth of the space-charge region can be selected based on the applied potential from the power supply 12.

A near field scanning optical microscope 19 shines pinhole laser light at the electrically biased semiconductor surface. Illumination of the depletion layer with light energy greater than the band gap creates electron-hole pairs. The field in the depletion layer separate these electron-hole pairs in opposite direction causing an electric current (photocurrent) in the system. This current can be optimized taking into account the adsorption behavior of light, minority carrier diffusion length, and applied potential. The photocurrent is proportional to the doping concentration of the illuminated region of the depletion layer.

A three dimensional doping profile can be displayed at a control and display unit (CDU) 20 which may be a computer with data acquisition capabilities. The computer can be programmed to generate a visual indication of the profile based on current measurements. The computer can also control the power supply as well as the microscope 19.

The profiler 10 utilizes principles of semiconductor photochemistry or photoelectrochemistry, coupled with scanning techniques to make a new high resolution microscope to image the doping distribution in a semiconductor. The resulting monitored current is a light-stimulated electrical signal that provides information for each pixel in a scanned image. The size of the light limits the lateral resolution, while the externally applied voltage from the power supply 12 controls the depth (z-direction) of the region sampled.

While it is possible to use a lens system to focus the beam of light to a small spot on the sample surface, as will be described with reference to the FIG. 3 embodiment, the resolution would be diffraction limited to about half the wavelength used. The embodiment of FIG. 1 uses near-field light energy from a coated optical fiber 22 that has been tapered and sharpened to 10–100 nm and could considerably exceed the diffraction limit.

The tip of the optical fiber 22 is located proximal the surface by a servo mechanism incorporated in the microscope 19, which includes an x-y-z piezo scanner 40 and a shear force detector 42 providing a z-feedback loop back to the control and display unit 20. Signal detection is facilitated by modulating the light from a laser 24 with a modulator 26 and synchronously detecting the photocurrent with a synchronous photocurrent detector 28. The semiconductor is located on an x-y positioning stage, schematically illustrated with directional arrows.

The substrate or semiconductor 16 to be imaged can be used in either electrochemical settings or in ambient\vacuum conditions. The electrochemical setting is best suited for semiconductors that will not undergo photocorrosion under the probing laser light. In either case, the ohmic contact 14 is made on the semiconductor wafer back surface. For air operation, a thin transparent layer of metal is deposited on the surface to be examined as the Schottky contact 18.

When the semiconductor is biased using the external power supply 12, the space charge region develops in the semiconductor interface region adjacent to the metal that forms the Schottky barrier contact. An alternative embodiment, shown in FIG. 3A, uses an electrolyte 30 instead of the metal coating (18 and 18'). In this electrochemical environment, the potential is controlled by a counter electrode 32 which extends into the electrolyte 30. The counter electrode 32, with the electrolyte in contact with the top surface of the semiconductor, provides the potential control. This is accomplished with a reference electrode 34 and a potentiostat 36 which provides the most stable potential control at the surface. The potentiostat is simply a power supply that controls potential and usually has a monitor electrode that helps regulate the potential.

Figure 3:
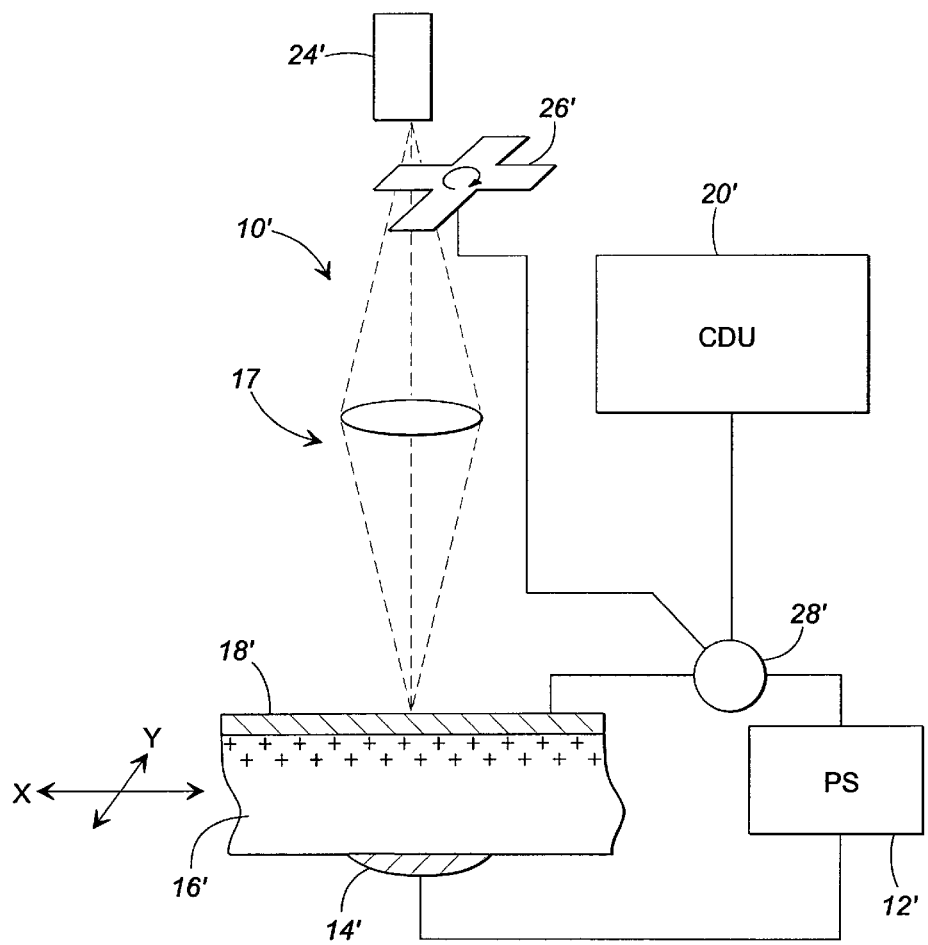
FIG. 3 is a schematic view of a second, preferred embodiment of the present invention.
Figure 3A:
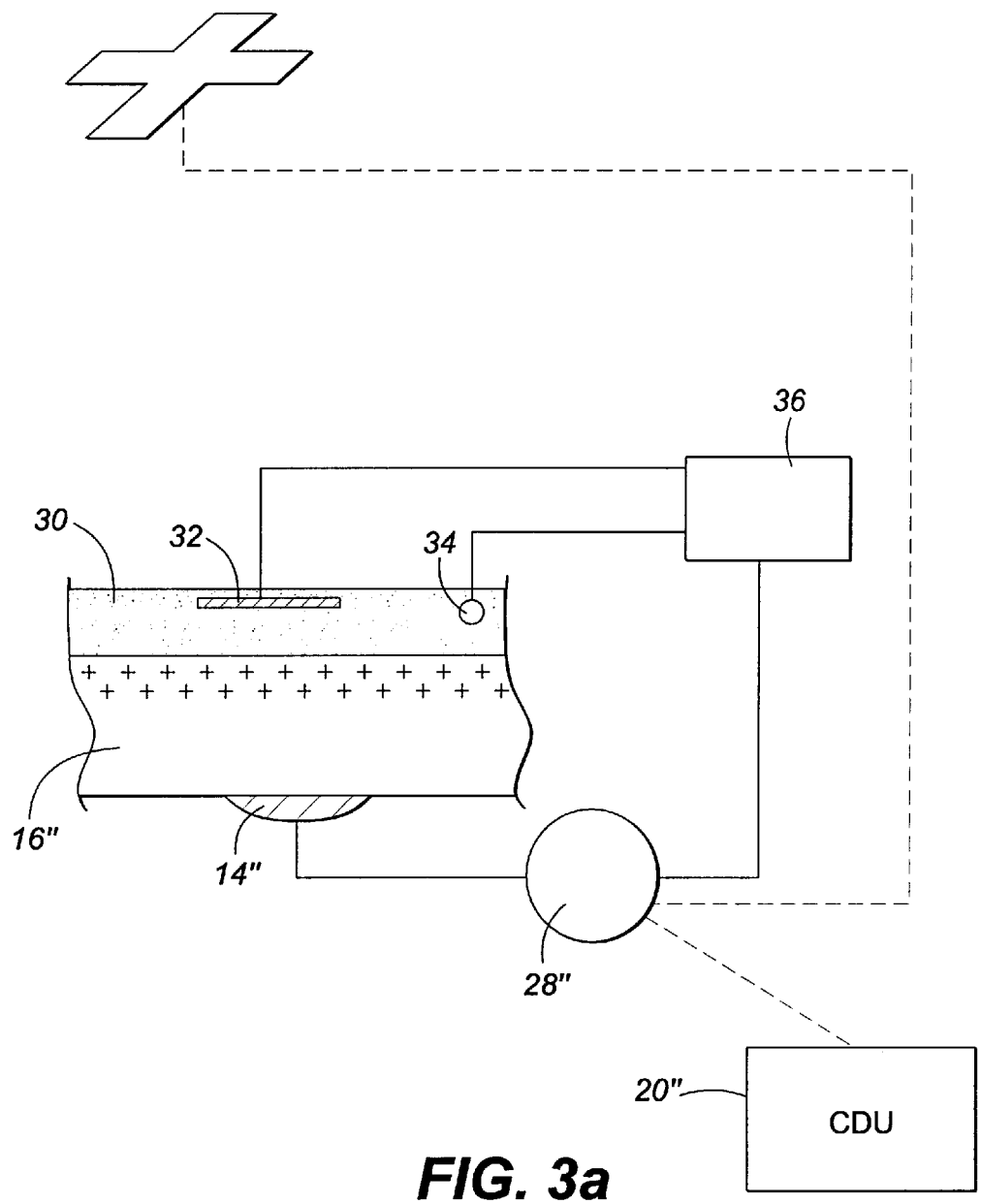
FIG. 3A is a schematic view of a modified version of the embodiment of FIG. 3.

In both environments, shown in FIGS. 3 and 3A, a space charge or depletion layer develops according to the potential applied and the doping. It is the carrier density in this layer that is photometrically probed to create a map of the doping concentration.

Depending on the sign and extent of the applied potential this space charge region can be accumulation (surplus majority carriers), flat band (no excess charge), or depletion (lack of majority carriers). The relationship between the charge distribution and space charge region can be derived by solving a Poison equation with appropriate boundary conditions. A simplified equation for excess charge in the semiconductor can be written as equation (1):

$$Q_{sc} = \sqrt{2\epsilon\epsilon_0 e N_0 (\phi_b - \phi_s)}$$

where $N_0$ is the donor or acceptor concentration, $\epsilon$ is the relative dielectric constant, $\epsilon_0$ is the permitivity of vacuum, $\phi_b$ and $\phi_s$ are the bulk and surface potential, respectively.

In electrochemical cases, the semiconductor is biased using ohmic back contact, a reference electrode and a counter electrode. In air/vacuum operation the semiconductor can be biased using an ohmic back contact and a transparent metal coating on the front surface, as shown in FIG. 1. The width of the depletion layer can be written as equation (2):

$$W = \sqrt{\frac{2\epsilon\epsilon_0}{eN_0}(\phi_b - \phi_s)}$$

Illumination of the depletion layer with a weakly absorbing light (where the penetration length of light is larger than the depletion layer thickness) of incident photon flux, $I_0$, produces a photocurrent, I, in the external circuit. The photocurrent can be derived as equation (3):

$$I = eI_0\left[1 - \frac{e^{-\alpha w}}{(1+\alpha L)}\right]$$

where w is the depletion layer thickness, $\alpha$ is the optical absorption coefficient, and L is the minority carrier diffusion length. Choosing $\alpha w \ll 1$, we derive equation (4):

$$I \approx \frac{eI_0\alpha(w+L)}{(1+\alpha L)}$$

In the electrochemical mode there is no need for deposition of metal. The semiconductor-electrolyte interface acts to form the Schottky barrier with the space charge layer in the semiconductor.

The electrolyte should not have any redox species in it to avoid adsorption-induced surface charges that can affect the depletion layer. At the semiconductor-electrolyte interface, most of the applied voltage is dropped in the semiconductor. The potential drop in the semiconductor manifests itself as band bending. At the liquid side of the interface the potential drop takes place in the double layer and the extended double layer regions with the extent depending upon the concentration of the solution.

For the highest resolution operation, a sharpened and coated optical fiber tip is used for illumination of the sample volume, as shown in the embodiment of FIG. 1. The design and operation of this element is similar to that developed for near-field scanning optical microscopy. Briefly, a fiber is heated and pulled or etched for form a very sharp tip. An opaque coating, usually aluminum, is applied to the sides, while a 10–100 nm aperture is left at the terminus. Light injected at the other end of the fiber is constrained at the aperture by its dimensions. The tip is then brought to within a few nanometers of the surface by mechanical and piezoelectric actuators, as schematically represented in FIG. 1 by the microscope 19 which includes an x-y-z piezo scanner. These are generally known in the art of atomic force microscopy.

The z-position of the tip from the surface is regulated by monitoring the shearing force acting on the tip. In this way, it is possible to bring the light source close enough to the surface to avoid beam spreading, and sources as small as 10–20 nm are possible. The tip can be scanned over the surface using shear force regulation to control the height and avoid destructive contact. Also, it is important to maintain constant tip height position during scanning. This is accomplished with the z-feedback loop which connects the shear force detector of the microscope 19 to the control and display unit 20.

A two-dimensional map of photocurrent can be obtained by monitoring the current from the ohmic contact 14 on the semiconductor 16 while the light source is laterally scanned. The best signal to noise ratio would be obtained by modulating the light intensity from the laser 24 with the modulator 26 and synchronously detecting the photocurrent with the detector 28. The photocurrent at each position of the tip is related to the doping concentration directly under the tip by the second, third, and fourth equations noted above.

The depletion layer thickness can be varied by the bias, as shown in equation (2) above, so that depth profiling can also be done. A sensitive technique for recording the doping concentration as a function of depth is to modulate the bias while it is ramped. Synchronous detection of the modulated photocurrent would yield a signal related to the doping concentration at a particular depth. Modulation of both the light intensity and the bias could be accomplished, if desired, to yield a full three dimensional doping concentration.

Figure 2:
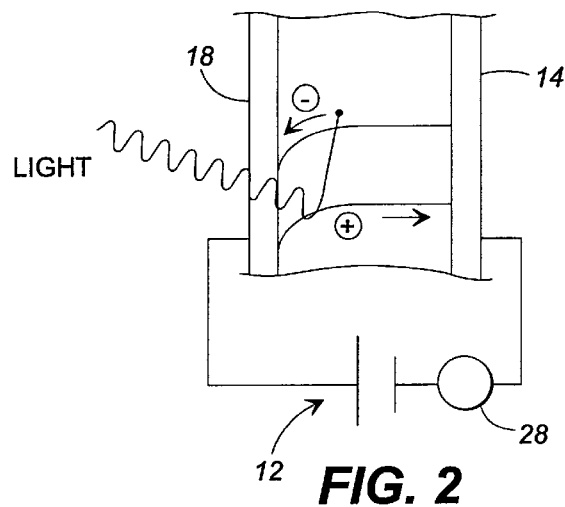
FIG. 2 is an enlarged schematic view illustrating photocurrent which facilitates profiling of a semiconductor according to the present invention.

FIG. 2 shows the interaction of light with a biased semiconductor. For electrochemical operation, the transparent metal coating is replaced by electrolyte. This illustration demonstrates one of the basic concepts employed by the invention.

FIG. 3 is an alternative embodiment in which like, but primed, reference numerals refer to like structure. In this embodiment, conventional far-field optical microscopy is employed, in which a focusing lens system 17 replaces the near-field microscope 19 of the previous embodiment. The conventional far-field system uses refractive or reflective lenses to confine the exciting light to a light spot having diameters of the order of the wavelength of light.

The computer, or CDU, controls the relative motion of the illumination source with respect to the semiconductor. In the far-field illumination both positioning and lateral scanning would be performed by the x-y table under computer control. High-resolution scanning in the near-field case is performed by the xyz piezo scanner of the microscope 19. Shear-force sensing regulates the distance of the fiber probe aperture to the surface.

The invention has several advantages over the prior art, including simplicity, given that the apparatus requires only a single connection to the sample. If a metallic layer, Schottky contact is used, it can be removed after testing so that the semiconductor is not destroyed or otherwise altered to a non-usable state. Generally, since no material is removed from the semiconductor, the analysis can be used in a non-destructive manner.

The present invention has numerous potential uses. For example, in the semiconductor industry, the invention can be used for quality control management by monitoring the uniformity of dopant concentration, minority carrier lifetime, or minority carrier diffusion length, for example.

Other uses include two dimensional mapping of localized pH measurements on a semiconductor-liquid interface, and in the study of corrosion, electrodeposition, and stress induced surface charge variations on semiconductor surfaces.

The methods described above with respect to the preferred embodiments can be modified such that, for example, the metal coated fiber optic tip could be placed in contact with the surface of a semiconductor, thereby forming a localized depletion layer inside the semiconductor. In this case, changes in photocurrent will be detected by recording changes in tunnel current. In this way, the need for metal coating on the semiconductor or placing the semiconductor in solution to form a Schottky barrier is obviated.

The invention can be used to construct a scanning photoelectrochemical microscope to investigate semiconductor surfaces. One can use this microscope to study localized changes in pH, changes in surface charge due to adsorption, deposition, dissolution, and presence of defects.

This technique can also be used for determining minority carrier lifetimes. In this case a pulsed laser is used and the decay of photocurrent is plotted as a function of time. Minority carrier diffusion length can also be investigated.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A semiconductor doping profiler comprising:

first contact means for forming a contact with one surface of the semiconductor;

second contact means for forming a contact with an opposite surface of the semiconductor;

voltage means coupled to the first and second contact means for establishing an electrical bias in the semiconductor which results in a space charge region in the semiconductor that varies in accordance with doping characteristics of the semiconductor and the applied electrical bias;

means for illuminating the space charge region with light energy to generate a photocurrent that correlates to the doping concentration of the illuminated region; and means for modulating the electrical bias so as to vary the depth of the space charge region in the semiconductor, whereby a three dimensional profile of the doping characteristics of the semiconductor can be determined.

2. A profiler according to claim 1, wherein the second contact means is a metallic coating deposited on the opposite surface of the semiconductor.

3. A profiler according to claim 1, wherein the second contact means is a counter electrode in an electrolyte which contacts the opposite surface of the semiconductor.

4. A profiler according to claim 3, wherein the counter-electrode potential is regulated by a reference electrode in the electrolyte.

5. A profiler according to claim 1, wherein the illuminating means includes an optical focusing system having means for confining the illumination to a localized area of the semiconductor surface.

6. A profiler according to claim 1, wherein the illuminating means comprises an optical fiber, means for positioning a distal end of the optical fiber in close proximity to the opposite surface of the semiconductor.

7. A profiler according to claim 6, wherein the positioning means includes means for maintaining the distal end of the optical fiber at a predetermined distance from the opposite surface of the semiconductor.

8. A profiler according to claim 7, wherein the positioning means further includes an x-y-z direction scanner and a shear force detector.

9. The semiconductor doping profiler of claim 1, wherein said first contact means comprises a means for forming an ohmic contact, and wherein said second contact means comprises a means for forming a Schottky contact.

10. An apparatus for analyzing a semiconductor comprising:

means for applying a voltage to opposite surfaces of the semiconductor to establish an electrical bias so as to form a space charge region in the semiconductor;

means for illuminating the semiconductor with light to thereby induce a photocurrent between the opposite surfaces of the semiconductor; and means for modulating the electrical bias so as to vary the depth of the space charge region in the semiconductor, wherein the photocurrent varies in accordance with at least one property of the semiconductor.

11. An apparatus according to claim 10, wherein the means for applying a voltage includes a d.c. power supply, first contact means for forming an ohmic contact with one surface of the semiconductor, and second contact means for forming a Schottky contact with an opposite surface of the semiconductor, whereby when the d.c. power supply is coupled to the first and second contact means, an electrical bias is established in the semiconductor which results in a space charge region in the semiconductor that varies in accordance with doping characteristics of the semiconductor and the applied electrical bias.

12. An apparatus according to claim 10, wherein the means for illuminating the semiconductor includes a light source and a focusing system.

13. An apparatus according to claim 10, wherein the means for illuminating the semiconductor includes a light source and a coated optical fiber having an aperture at a distal end.

14. An apparatus according to claim 13, further comprising means for positioning the distal end of the optical fiber in x, y and z directions.

15. An apparatus according to claim 14, wherein the positioning means includes means for maintaining the z direction distance of the optical fiber above the semiconductor surface while scanning in the x and y directions.

16. A method for analyzing a semiconductor comprising:

applying a voltage to opposite surfaces of the semiconductor to establish an electrical bias in the semiconductor which results in a space charge region in the semiconductor;

illuminating the semiconductor with light to thereby induce a photocurrent between the opposite surfaces of the semiconductor; and modulating the electrical bias so as to vary the depth of the space charge region in the semiconductor;

wherein the photocurrent varies in accordance with at least one property of the semiconductor.

17. A method according to claim 16, wherein the illuminating step comprises positioning a distal end of an optical fiber next to one of the surfaces of the semiconductor in the z direction, and then scanning the surface in the x and y directions while maintaining the z direction distance above the semiconductor surface.

18. A method according to claim 16, further comprising modulating the illumination source and recording the time-dependent photocurrent.

19. A method according to claim 16, further comprising varying the applied voltage, recording the photocurrent, and correlating the photocurrent to the doping profile perpendicular to the semiconductor surface.

20. A method according to claim 16, further comprising constraining the illumination region to a small area of the semiconductor surface.

* * * * *